(12) United States Patent
Jeong

(10) Patent No.: US 7,670,637 B2
(45) Date of Patent: Mar. 2, 2010

(54) APPARATUS FOR APPLYING COATING SOLUTION AND METHOD OF FABRICATING LIQUID CRYSTAL DISPLAY DEVICE USING THE SAME

(75) Inventor: Tae Kyun Jeong, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 604 days.

(21) Appl. No.: 11/298,617

(22) Filed: Dec. 12, 2005

(65) Prior Publication Data
US 2006/0283535 A1    Dec. 21, 2006

(30) Foreign Application Priority Data
Jun. 20, 2005  (KR) ...................... 10-2005-0053189

(51) Int. Cl.
*C23C 16/52*   (2006.01)
*B05D 5/12*    (2006.01)
(52) U.S. Cl. .............................. 427/8; 427/58; 427/162; 427/240; 427/466; 427/498; 425/466
(58) Field of Classification Search .................... 427/8, 427/58, 162, 240, 466, 498; 216/23, 41, 216/33; 425/466
See application file for complete search history.

(56) References Cited

U.S. PATENT DOCUMENTS

| | | | | |
|---|---|---|---|---|
| 5,425,967 | A * | 6/1995 | Tomaru ...................... | 427/356 |
| 5,464,577 | A * | 11/1995 | Leonard et al. ............ | 264/40.5 |
| 6,417,908 | B2 * | 7/2002 | Nishiguchi et al. .......... | 349/155 |
| 6,897,099 | B2 * | 5/2005 | Yoo et al. ................... | 438/149 |
| 7,018,474 | B2 * | 3/2006 | Mandai et al. .............. | 118/419 |
| 2002/0110640 | A1 * | 8/2002 | Tateyama et al. ........... | 427/240 |
| 2005/0089790 | A1 * | 4/2005 | Lee et al. .................... | 430/141 |

\* cited by examiner

*Primary Examiner*—Shamim Ahmed
(74) *Attorney, Agent, or Firm*—McKenna Long & Aldridge LLP

(57) ABSTRACT

An apparatus for applying a coating solution and a method of fabricating a liquid crystal display device using the same are provided. In order to improve the shape of the inside of the nozzle and to secure the geometrical uniformity of the inside of the nozzle, the apparatus includes a nozzle comprising a nozzle body, the nozzle body including an external body and an internal body. A distance between the external body and the internal body is controlled. An inlet port is provided on the nozzle body so that coating solution is received, and a discharge port is provided below the nozzle body to coat the surface of a material to be processed with the coating solution and a driving unit for moving the nozzle in a predetermined direction.

3 Claims, 4 Drawing Sheets

US 7,670,637 B2

APPARATUS FOR APPLYING COATING SOLUTION AND METHOD OF FABRICATING LIQUID CRYSTAL DISPLAY DEVICE USING THE SAME

This application claims the benefit of Korean Patent Application No. 2005-53189, filed on Jun. 20, 2005, which is hereby incorporated by reference for all purposes as if fully set forth herein.

BACKGROUND OF THE INVENTION

1. Field of the Invention

The present invention relates to an apparatus for applying a coating solution. More particularly, the present invention relates to an apparatus for uniformly applying coating solution such as photoresist, development solution, and color filters to the surface of a processed material such as a substrate of a flat panel display (FPD) and a semiconductor wafer and a method of fabricating a liquid crystal display device using the same.

2. Discussion of the Related Art

A plurality of thin film depositing processes, photolithography processes for exposing a selected region of the thin film, and etching processes of removing the thin film of the exposed region are included in processes of fabricating a flat panel display (FPD) or a semiconductor device. In particular, the photolithography process is composed of a coating process of forming a photosensitive film of a photosensitive material on a substrate or a wafer and exposure and development processes of patterning the photosensitive film using a mask in which a predetermined pattern is formed.

In general, a spray coating method, a roll coating method, or a spin coating method is used for the coating process of forming the photosensitive film on the substrate or the wafer.

The spray coating method and the roll coating method are not suitable for forming a highly precise pattern in terms of control of uniformity and thickness of a film so that the spin coating method is used for forming the highly precise pattern.

Hereinafter, a spin coater used for the spin coating method will be described in detail with reference to the drawing.

FIG. 1 is a sectional view illustrating the structure of a related art spin coater.

As illustrated in FIG. 1, the spin coater includes a spin chuck 5 connected to a rotation shaft 6, a cover 7 that surrounds the spin chuck 5 in the outside to be opened and closed, and a nozzle 4 provided above the spin chuck 5 to move to the inside of the cover 7 when the cover 7 is opened and to spray photoresist.

A material to be processed 10 coated with photoresist is settled in the spin chuck 5 and a drain valve (not shown) that discharges the photoresist that falls below the cover 7 to the outside is provided below the cover 7.

According to the spin coater of the above structure, in order to form a coating film on the predetermined material to be processed 10, the nozzle 4 is lowered to spray photoresist on the surface of the material to be processed 10.

When photoresist is sprayed on the material to be processed 10, the cover 7 is closed, a motor M rotates, and the rotation shaft 6 connected to the motor M rotates so that the spin chuck 5 in which the material to be processed 10 is rotated a predetermined number of times.

When the spin chuck 5 rotates, the photoresist sprayed on the top surface of the material to be processed 10 spreads to the outside by a centrifugal force so that the entire surface of the material to be processed 10 is coated with photoresist.

When the entire surface of the material to be processed 10 is coated with photoresist, the photoresist with which the entire surface of the material to be processed 10 is coated is solidified and exposure and development are performed using a photo mask so that a predetermined pattern is formed on the surface of the material to be processed 10.

The spin coating method using the spin coater is suitable for coating a small material to be processed such as a wafer with a photosensitive material. However, it is not suitable for coating a large and heavy FPD substrate such as a glass substrate with a photosensitive material.

This is because it is very difficult to rotate the large and heavy substrate to be coated with the photosensitive material at high speed and the substrate is damaged and a large amount of energy is consumed when the substrate rotates at high speed.

Also, in the spin coating method, since a much larger amount of photoresist is thrown away than the amount of photoresist that is used, photoresist is wasted. That is, a significant amount of photoresist applied to the surface of the substrate is scattered to the outside of the spin chuck to be thrown away when the substrate rotates at high speed. The amount of wasted photoresist is much larger than the amount of the photoresist applied to the substrate to be used for making the substrate photosensitive and the fragments of the scattered photoresist may operate as foreign substances and may contaminate environments.

SUMMARY OF THE INVENTION

Accordingly, the present invention is directed to an apparatus for applying a coating solution and a method of fabricating liquid crystal display device using the same that substantially obviate one or more of the problems due to limitations and disadvantages of the related art.

An advantage of the present invention to provide an apparatus for uniformly applying coating solution such as photoresist, development solution, and color filters to a large substrate and a method of fabricating a liquid crystal display device using the same.

Another advantage of the present invention to provide an apparatus for applying a coating solution capable of improving the internal shape of a nozzle to secure the arithmetic uniformity of the inside thereof and a method of fabricating a liquid crystal display device using the same.

To achieve the above advantages and in accordance with the purpose of the present invention, as embodied and broadly described, an apparatus for applying a coating solution comprising a nozzle comprising a nozzle body including an external body and an internal body, wherein a distance between the external body and the internal body is controlled, an inlet port on the nozzle body for receiving a coating solution and a discharge port below the nozzle body to coat a surface of a material to be processed with the coating solution; and a driving unit for moving the nozzle in a predetermined direction.

In another aspect of the present invention, a method of fabricating a liquid crystal display device, the method comprising providing a first substrate and a second substrate, coating surfaces of the first and second substrates with a coating solution using a nozzle comprising a nozzle body including external and internal bodies, wherein a distance between the external and internal bodies is controlled, an inlet port on the nozzle body to receive the coating solution, and a discharge port below the nozzle body to apply the coating solution, forming a thin film transistor pattern and a color filter pattern on the first substrate and the second substrate coated with the coating solution using a photolithography process, and attaching the first substrate and the second substrate to each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
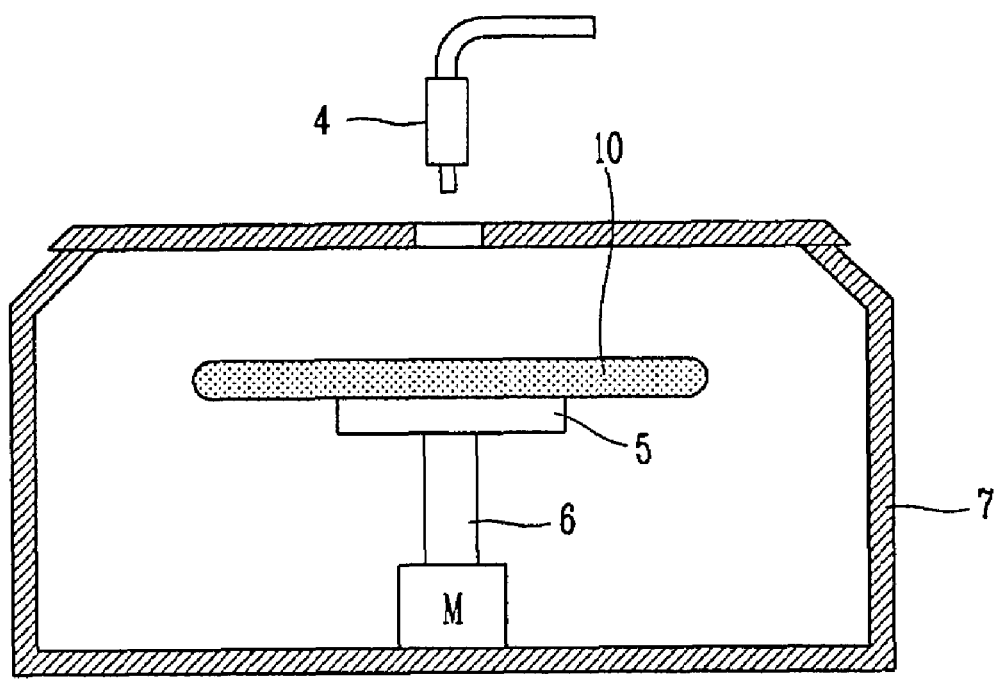
FIG. 1 is a sectional view illustrating the structure of a related art spin coater.
Figure 2A:
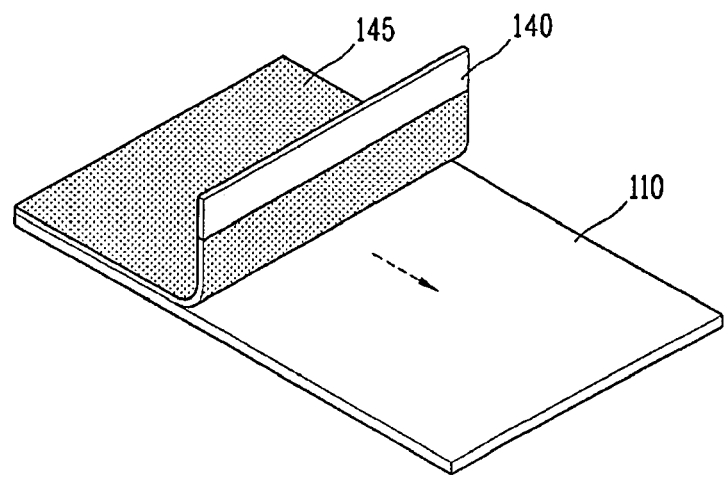
FIGS. 2A and 2B are perspective views illustrating a basic concept of a slit coater and a photosensitive material applied by the slit coater.
Figure 2B:
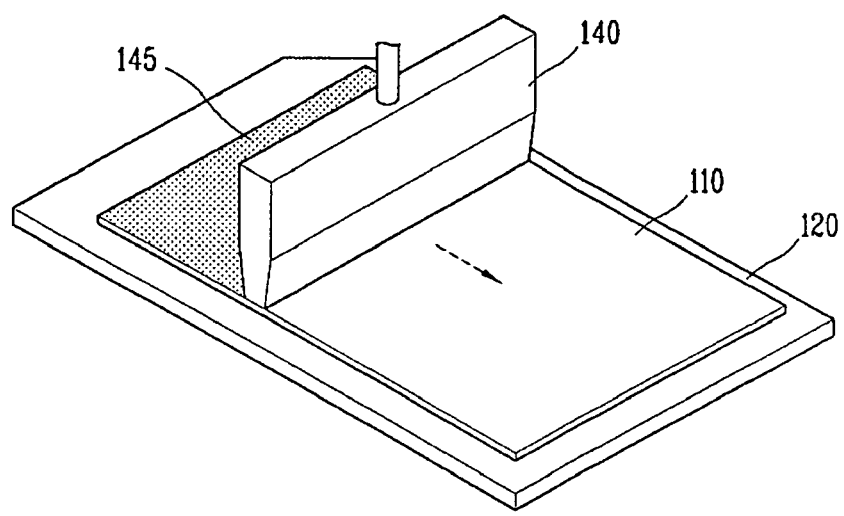

Reference will now be made in detail to an embodiment of the present invention, examples of which are illustrated in the accompanying drawings FIGS. 2A and 2B illustrate a basic concept of a slit coater and a photosensitive material that is applied by the slit coater.

As illustrated in the drawings, a slit coater according to the present invention includes a slit nozzle 140 whose width is small and whose length is large. Photoresist 145 is supplied to a substrate 110 by the slit nozzle 140 so that the surface of the substrate 110 is coated with the photoresist 145 in the form of a surface.

Generally, in fabricating semiconductor and a flat panel display (FPD), in order to pattern a thin film that performs a specific function such as an oxide thin film, a metal thin film, and a semiconductor thin film to a desired shape, the above-described photolithography process is required. A photosensitive material such as photoresist that chemically reacts to light is used for the photolithography process.

At this time, defects are not generated during the process when the photosensitive material having a uniform thickness is formed on the substrate where the thin film is formed. For example, when the thickness of the photosensitive material is larger than a designated thickness, a desired part of the thin film is not etched. When the thickness of the photosensitive material is smaller than the desired thickness, a larger amount of the thin film than the desired amount is etched.

The uniform application of the photosensitive material is one of very important factors in a current trend where the size of the FPD substrate increases according as the size of the FPD such as a liquid crystal display panel increases.

In order to solve the above problem, according to the present invention, a nozzle method of applying a predetermined photosensitive material using a slit nozzle without using a spinner such as the related art spin chuck is provided. Since the spinner is not used, the photosensitive material is applied through a spinless coater or a slit nozzle. The nozzle method coating solution applying apparatus is referred to as a slit coater. Since the slit coater supplies the photosensitive material through a slit nozzle whose length is larger than a width to coat the surface of the substrate with the photosensitive material in the form of a surface, the slit coater is suitable for coating a large liquid crystal display panel substrate with the photosensitive material.

That is, referring to the drawings, the slit coater coats the substrate 110 with a predetermined amount of the photoresist 145 through the slit nozzle 140. The slit coater applies a uniform amount of photoresist 145 through the slit nozzle 140 while moving from one side of the substrate 110 to the other side of the substrate 10 at a uniform speed to form a uniform photosensitive film on the surface of the substrate 110.

Also, since the slit coater can apply the photoresist 145 only to the desired part of the surface of the substrate 110, it is possible to use the coating solution without wasting the coating solution compared with the above-described spin coater. The slit coater is suitable for a large substrate or a square substrate.

For reference, reference numeral 120 denotes a table on which the substrate 110 is settled. The photoresist 145 is applied in the direction where the nozzle 140 moves, that is, in the direction of the arrow.

Figure 3:
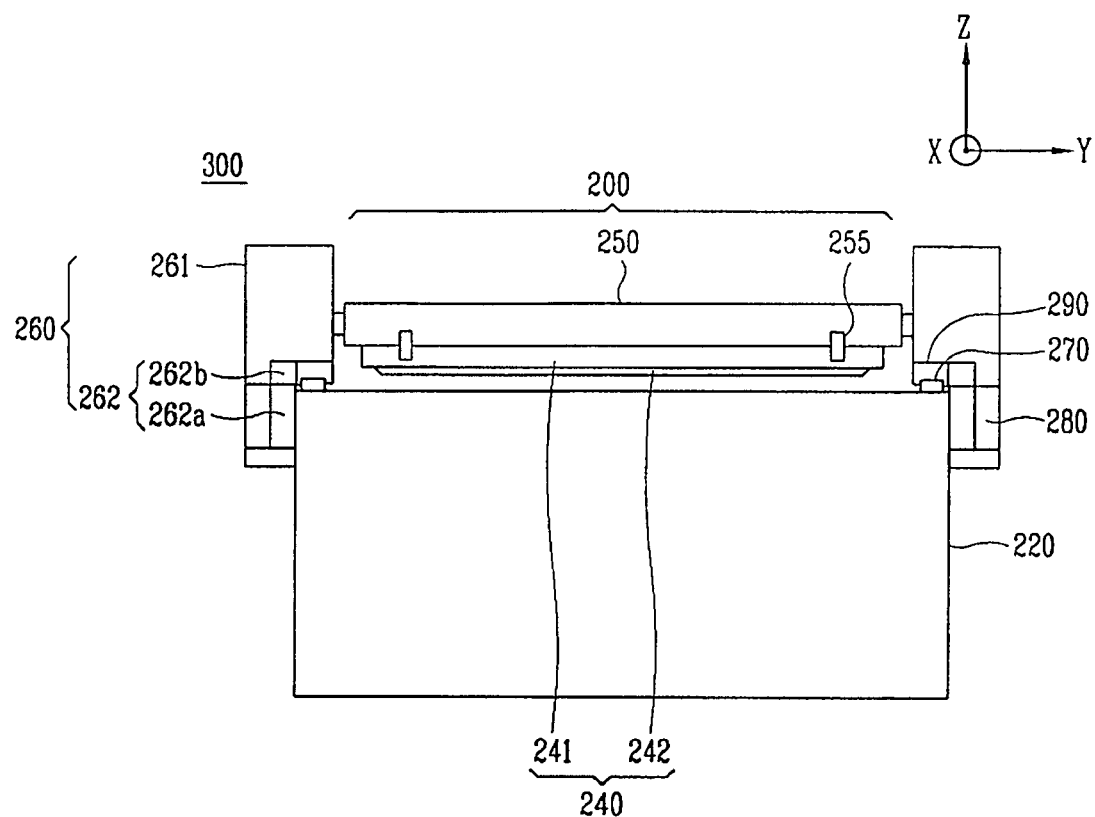
FIG. 3 schematically illustrates a slit coater according to an embodiment of the present invention.

FIG. 3 is a front view schematically illustrating a slit coater according to an embodiment of the present invention.

In the slit coater according to the present embodiment, a square glass substrate is used as a substrate to be processed in order to fabricate a liquid crystal display panel. The substrate is used as a coating solution in a process of coating the surface of the substrate with the coating solution in the photolithography process for performing predetermined patterning. Also, a flexible display plastic substrate or a common FPD substrate as well as the liquid crystal display glass substrate may be used for the substrate.

As illustrated in FIG. 3, a slit coater 300 according to the present embodiment includes a table 220 on which a substrate (not shown) is settled, a slit nozzle unit 200 for coating the substrate with the coating solution, for example, the photosensitive material such as photoresist, and driving units 260 provided at both ends of the slit nozzle unit 200 to move the slit nozzle unit 200 at a uniform speed. Also, the slit coater 300 includes a supply unit (not shown) for supplying the photosensitive material to the substrate and a pumping means (not shown) for supplying the photosensitive material from a supply unit to the slit nozzle unit 200 and applying predetermined pressure so that the photosensitive material is scattered.

Although not shown, the supply unit includes a storage tank for storing the photosensitive material, a supply pipe for supplying the stored photosensitive material to the slit nozzle unit 200, and a flow amount controlling unit.

The storage tank may be attached to the driving units 260 to store photosensitive solution such as the photoresist supplied to the slit nozzle unit 200, development solution, and the coating solution such as color filters.

Pumping means applied uniform pressure to the slit nozzle unit 200 so that the photosensitive material stored in the slit nozzle unit 200 is sprayed by the pressure. At this time, the pumping means may be provided in the storage tank to apply pressure to the inside of the storage tank so that the coating solution stored in the storage tank is supplied to the slit nozzle unit 200.

A material to be processed such as a glass substrate is settled on the table 220 and a plurality of pins (not shown) for lifting up the substrate from the table 220 are provided on the surface of the table 220.

The table 220 may be formed of a rectangular stone whose top surface and side surfaces are processed to be flat.

The top surface of the table 220 is even so that the substrate is settled thereon. A plurality of vacuum absorbing holes (not shown) are formed on the top surface of the table 220 so that the substrate is maintained even by absorbing the substrate while the slit coater 300 processes the substrate.

Although not shown in FIG. 3, a pre-discharging device is provided on one side of the table 220 so that pre-discharging is performed by the slit nozzle unit 200 when coating starts first or after coating is completed every time. Therefore, the entire surface of the slit nozzle unit 200 is uniformly coated with the coating solution.

The driving units 260 include a pair of X-axis driving devices 262 provided on both ends of the slit nozzle unit 200 to move a pair of Z-axis driving devices 261 for moving the slit nozzle unit 200 in a perpendicular direction (in the Z-axis direction) and the slit nozzle unit 200 from front to rear (in the X-axis direction) at a uniform speed so that the surface of the substrate is uniformly coated with the photosensitive material.

Each of the X-axis driving devices 262 may include a motor (not shown), moving means 270 such as a moving rail and a guide rail. A non-contact type linear motor may be used as the motor.

The moving means 270 guide the movement of the slit nozzle unit 200 together with supporting blocks 290 fixed to both ends of the table 220. That is, the moving means 270 move the slit nozzle unit 200 in the X-axis direction of the table 220 in order to coat the substrate with the coating solution by the slit nozzle unit 220.

The slit nozzle unit 200 is provided on the table 220 and includes a slit nozzle 240 having a length corresponding to at least one surface of the substrate and a head 250 in which the nozzle 240 is loaded. Also, the slit nozzle unit 200 includes gap sensors 255 for measuring a gap between the nozzles 240.

The nozzle 240 includes a nozzle body 241, an introduction port (not shown), and a discharge port 242. At this time, the nozzle body 241 includes an accommodating space for storing the photosensitive material, the introduction port is formed on the nozzle body 241, and the discharge port 242 is formed on the bottom surface that faces the substrate in the nozzle body 241. The discharge port 242 is in the form of a slit whose length is larger than its width.

The nozzle 240 of the above structure moves from one side of the substrate to the other side of the substrate through the X-axis driving apparatuses 262 to coat the substrate with the photosensitive material so that a photosensitive film of a uniform thickness is formed on the surface of the substrate. Unlike the above, the substrate 110 may move in the state where the nozzle 240 is fixed to perform the same photosensitive film forming process.

Hereinafter, the structure of the nozzle 240 of the slit coater 300 according to the present invention of the above structure will be described in detail with reference to FIG. 4.

Figure 4:
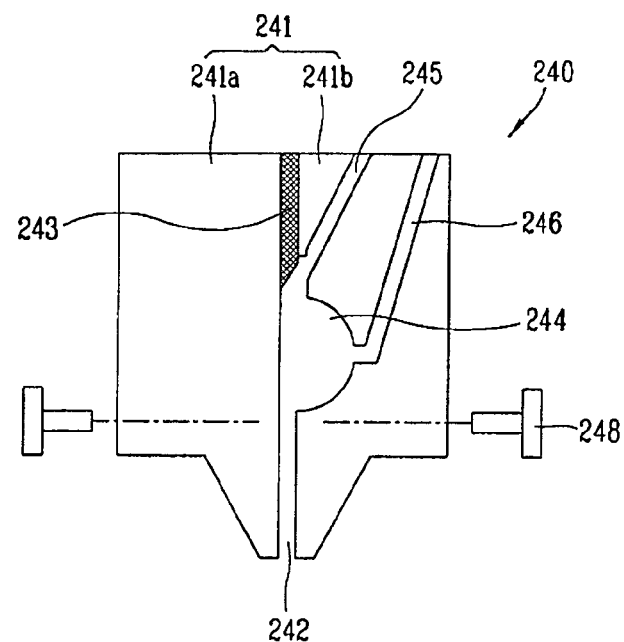
FIG. 4 schematically illustrates the section of a nozzle according to a first embodiment of the present invention.

FIG. 4 schematically illustrates the section of a nozzle according to a first embodiment of the present invention.

As illustrated in FIG. 4, the nozzle 240 includes a first nozzle body 241a, a second nozzle body 241b, an inlet port 246, and a discharge port 242.

The two nozzle bodies 241a and 241b are coupled with each other to form a nozzle body 241. An accommodating space 244 in which a predetermined amount of photosensitive material is temporarily stored is formed between the first nozzle body 241a and the second nozzle body 241b in order to uniformly apply the photosensitive material pressed by pumping means.

The inlet port 246 is formed on the second nozzle body 241b to supply the photosensitive material to the accommodating space 244. The discharge port 242 is formed on the bottom surface that faces the substrate in the form of a slit its length is larger than its width to coat the surface of the substrate with the photosensitive material.

A gap between the first nozzle body 241a and the second nozzle body 241b is determined and maintained by a very thin shim 243 formed of stainless steel. Reference numeral 245 denotes a vent for removing the air formed in the nozzle 240.

The geometrical uniformity and symmetry of the inside of the nozzle 240 according to the present embodiment is controlled by a plurality of bolts 248 provided in the lower end of the nozzle body 241. That is, when the geometrical uniformity of the inside of the nozzle 240 deteriorates, the plurality of bolts 248 formed on the left and right sides of the nozzle 240 are loosened or tightened to restore the symmetry of the distorted nozzle 240. Securing the geometrical uniformly of the inside of the nozzle 240 is important to having the surface of the substrate uniformly coated with the coating solution. The nozzle 240 according to the first embodiment is symmetrical and the uniformity thereof is controlled by forming the bolts 248 in the outside of the nozzle 240. A nozzle according to another embodiment whose uniformity can be controlled by changing the shape of the inside of the nozzle will be described in detail.

Figure 5:
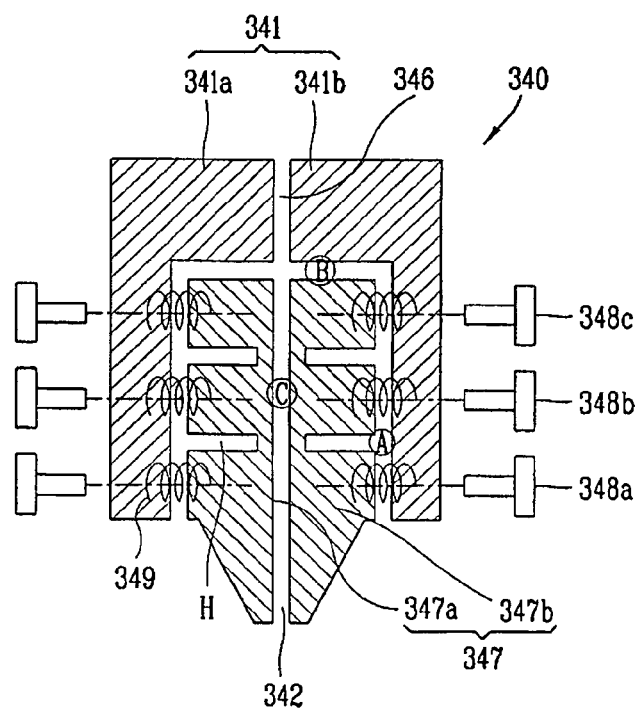
FIG. 5 schematically illustrates the section of a nozzle according to a second embodiment of the present invention.

FIG. 5 schematically illustrates the section of a nozzle according to a second embodiment of the present invention, which schematically illustrates the shape of the inside of the nozzle.

As illustrated in FIG. 5, a nozzle 340 according to the present embodiment includes nozzle bodies 341 and 347, an inlet port 346, and a discharge port 342.

The nozzle bodies 341 and 347 are divided into an external nozzle body 341 and an internal nozzle body 347. The external nozzle body 341 is divided into a first external nozzle body 341a and a second external nozzle body 341b. The internal nozzle body 347 is divided into a first internal nozzle body 347a and a second internal nozzle body 347b.

In FIG. 5, the inlet port 346 may be formed between the first nozzle body 341a and the second nozzle body 341b. The inlet port 346 may also be formed on the second nozzle body 341b, similar to the first embodiment.

Also, the discharge port 342 is formed on the bottom surface of the nozzle 340 that faces the substrate in the form of a slit whose length is larger than its width to coat the surface of the substrate with the photosensitive material.

In order to secure the geometrical uniformity of the inside of the nozzle 340 according to the present embodiment, the nozzle 340 is composed of left and right bodies 341a and 347a and 341b and 347b. The left and right bodies 341a and 347a and 341b and 347b are composed of a first external nozzle body 341a and a second external nozzle body 341b and a first internal nozzle body 347a and a second internal nozzle body 347b.

The left and right bodies 341a and 347a and 341b and 347b are coupled with each other by a plurality of bolts 348a to 348c so that a distance between the left and right internal bodies 347a and 347b a region "c", can be controlled by tightening and loosening the bolts 348a to 348c.

Also, concavo-convex shapes such as grooves H may be formed in predetermined regions of the internal bodies 347a and 347b. When the top and bottom bolts 348a to 348c are separately controlled, it is possible to effectively control the distance between the left and right internal bodies 347a and 347b from top to bottom.

In FIG. 5, the three bolts 348a to 348c are formed from top to bottom. However, the present invention is not limited to the above. Three or more bolts may be formed from top to bottom in order to effectively control the geometrical uniformity of the inside of the nozzle 340. The plurality of bolts 348a to 348c may be formed from front to rear of the nozzle 340. Also, in FIG. 5, the grooves H are formed in the internal bodies 347a and 347b. However, the present invention is not limited to the above. The grooves may not be formed in the internal bodies 347a and 347b.

An elastic body 349 such as a spring may be inserted between, a region "a", the internal bodies 347a and 347b and the external bodies 341a and 341b where the bolts 348a to 348c are provided. The elastic body 349 maintains the distance between the internal bodies 347a and 347b and the external bodies 341a and 341b uniformly and controls the gap between (region "c") the left and right internal bodies 347a and 347b while the bolts 348a to 348c proceed and recede.

The regions "a" and "b" have no gaps so that two structures (the left and right internal bodies 347a and 347b and external bodies 341a and 341b) are attached to each other and the region "c" has a uniform gap in accordance with processes and set conditions.

The nozzle 340 is composed of the left and right two bodies 341a and 347a and 341b and 347b. The left and right bodies 341a and 347a and 341b and 347b are composed of the external first nozzle body 341a and the external second nozzle body 341b and the internal first nozzle body 347a and the internal second nozzle body 347b. The distances between (the regions "a" and "c") the bodies 341a and 347a and 341b and 347b are controlled using the bolts 348a to 348c, the elastic body 349, and the grooves H so that it is possible to effectively secure the geometrical uniformity and symmetry of the inside of the nozzle 340. As a result, the photosensitive material may be uniformly applied so that it is possible to improve the completeness of the coating apparatus. Therefore, it is possible to improve yield and productivity.

Also, the nozzle 340 according to the present invention can effectively cope with the case in which it is necessary to change the distances (in particular, the region "c") of the inside of the nozzle 340 in accordance with the kind of the photosensitive solution such as photoresist, the development solution, and the coating solution such as color filters.

Hereinafter, a method of fabricating a liquid crystal display device to which the apparatus for applying the coating solution according to the present invention is applied will be described in detail.

The method of fabricating the liquid crystal display device includes an array process of forming an array substrate, a color filter process of forming a color filter substrate, and a cell process of attaching the array substrate and the color filter substrate to each other to form a unit liquid crystal display panel, which will be described in detail as follows.

First, a plurality of gate lines and data lines are vertically and horizontally arranged on a transparent insulating substrate, such as glass, to define a plurality of pixel regions. Thin film transistors (TFT) that are switching devices are connected to the gate lines and the data lines formed in the pixel regions. Also, pixel electrodes are connected to the TFTs through the array process to drive a liquid crystal layer according to signals applied through the TFTs. In the case of a horizontal electric field mode, the pixel electrodes and common electrodes that form a horizontal electric field in the liquid crystal layer are formed together during the array process.

Also, color filters composed of sub-color filters of red, green, and blue colors and black matrices provided among the sub-color filters to intercept light that passes through the liquid crystal layer are formed on a color filter substrate by the color filter process.

The black matrices may be formed of an organic film made of a resin such as a colored organic resin such as acryl, epoxy, or polyimide resin including one of carbon black and black pigment.

Next, an overcoat layer formed of a transparent insulating material is formed on the entire surface of the color filter substrate.

The overcoat layer may be formed of a transparent resin having an insulating property, in particular, acryl resin or epoxy resin, in order to planarize the substrate on which the color filters are formed and to prevent pigment ions from melting.

A plurality of photolithography processes are required for the array process and the color filter process in order to form patterns such as the TFTs and the color filters.

The photolithography process is a series of processes of transcribing a pattern painted on a mask to a substrate on which a thin film is deposited to form a desired pattern and is composed of a plurality of processes of applying the photosensitive solution and performing exposure and development.

When the apparatus for applying the coating solution according to the present invention is used for applying the photosensitive solution, it is possible to uniformly coat the entire surface of the substrate with the photosensitive solution to obtain a desired pattern. As a result, it is possible to improve yield and productivity.

Next, spacers are formed of an organic film on the color filter substrate or the array substrate.

Column spacers (or patterned spacers) fixed to the array substrate or the color filter substrate are used according as the size of the liquid crystal display panel increases.

Then, after forming orientation films on the array substrate and the color filter substrate, respectively, an orientation process is performed on the orientation films in order to provide an orientation control force or a surface fixation force (that is, a pretilt angle and an orientation direction) to the liquid crystal molecules of the liquid crystal layer formed between the two substrates. At this time, rubbing or optical orientation may be used as the orientation method.

Next, a predetermined seal pattern is formed on the color filter substrate by a sealant and, at the same time, the liquid crystal layer is formed on the array substrate.

Then, pressure is applied to the array substrate and the color filter substrate so that the array substrate and the color filter substrate are attached to each other to form a unit liquid crystal display panel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, the method comprising:
providing a first substrate and a second substrate on a table;
providing a slit nozzle unit having a slit nozzle on the table;
providing a pre-discharging device on one side of the table so that pre-discharging is performed by the slit nozzle when coating starts first or after coating is completed;
uniformly applying a coating solution on the first substrate and the second substrate, respectively, using the slit nozzle comprising left and right bodies, an inlet port on the left and right bodies to receive the coating solution, a discharge port below the left and right bodies to apply the coating solution and an elastic body, wherein the left and right bodies are composed of a first external nozzle body and a second external nozzle body and a first internal nozzle body and a second internal nozzle body, respectively, wherein the left and right bodies are coupled with each other by a plurality of bolts so that a distance between left and right internal bodies is controlled by tightening and loosening the bolts wherein top and bottom bolts are separately controlled to effectively control the distance between the left and right internal bodies from top to bottom and wherein the elastic body is inserted between the internal nozzle bodies and the external nozzle bodies where the bolts are provided to uniformly maintain the distance between the internal nozzle bodies and the external nozzle bodies and control a gap between the left and right bodies while the bolts to proceed and recede;

forming a thin film transistor pattern and a color filter pattern on the first substrate and the second substrate, respectively, using a photolithography process; and attaching the first substrate and the second substrate to each other.

2. The method as claimed in claim 1, wherein the coating solution comprises a photosensitive solution for a photoresist, development solution, or color filters.

3. The method as claimed in claim 1, further comprising forming a liquid crystal layer between the first substrate and the second substrate.

* * * * *